United States Patent [19]

Schempp

[11] Patent Number: 5,252,850
[45] Date of Patent: Oct. 12, 1993

[54] APPARATUS FOR CONTOURING A SEMICONDUCTOR, LIGHT RESPONSIVE ARRAY WITH A PRESCRIBED PHYSICAL PROFILE

[75] Inventor: William V. Schempp, Tucson, Ariz.

[73] Assignee: Photometrics Ltd., Tucson, Ariz.

[21] Appl. No.: 826,028

[22] Filed: Jan. 27, 1992

[51] Int. Cl.$^5$ .............................. H01L 39/02
[52] U.S. Cl. .................. 257/433; 257/698; 257/783
[58] Field of Search ............ 257/433, 678, 684, 711, 257/717, 722, 698, 782, 783, 701, 702, 703; 361/398

[56] References Cited

U.S. PATENT DOCUMENTS

| | | | |
|---|---|---|---|
| 3,588,018 | 8/1972 | Hiscocks | 257/698 |
| 4,884,124 | 11/1989 | Mori et al. | 257/783 |
| 4,942,454 | 7/1990 | Mori et al. | 257/674 |
| 4,962,416 | 10/1990 | Jones et al. | 257/783 |
| 4,975,765 | 12/1990 | Ackermann et al. | 257/692 |
| 5,072,289 | 12/1991 | Sugimoto et al. | 257/701 |
| 5,172,301 | 12/1992 | Schneider | 257/783 |

*Primary Examiner*—Rolf Hille
*Assistant Examiner*—Minhloan Tran
*Attorney, Agent, or Firm*—Herbert M. Shapiro

[57] ABSTRACT

Large area semiconductor wafers such as CCDs typically have a non-flat profile. A vacuum chuck is used to generate a vacuum under the chip to reduce the curvature to conform to the flat profile of the substrate surface through which the vacuum is generated. Other than flat final profiles are useful also.

5 Claims, 2 Drawing Sheets

APPARATUS FOR CONTOURING A SEMICONDUCTOR, LIGHT RESPONSIVE ARRAY WITH A PRESCRIBED PHYSICAL PROFILE

BACKGROUND OF THE INVENTION

Semiconductor, light responsive arrays such as Charge Coupled Devices (CCDs) or Charge Injection Devices (CIDs) are well known in the art. Such devices include an array of light sensitive cells each of which is responsive to light to store (or deplete) charge in proportion to light incident thereto during an exposure phase of a cycle of operation. The cells are arranged in rows and columns and the charges obtained during the exposure phase are moved along the columns, shift register fashion, to an output buffer between exposure phases. Such devices (CCDs) are well known to be useful as imaging devices in CCD cameras.

Devices of these types are made in various sizes, the manufacturing effort being directed at making ever larger chips with ever increasing numbers of cells. Chips having diameters from one to several centimeters are now commercially available with more than 256,000 cells per chip.

BRIEF DESCRIPTION OF AN ILLUSTRATIVE EMBODIMENT OF THE INVENTION

The invention is based on the recognition that semiconductor chips are not flat and the bow to the chips increases with the diameter of the chips. The curvature becomes significant particularly for chips having diameters of one centimeter or more. The curvature in the chips causes loss of resolution and general degradation in the image captured by the array of cells on the chip. Accordingly, the invention is directed at apparatus and a method for imposing a flat geometry to a semiconductor chip. Further, it is recognized that there are advantages to contouring such a semiconductor chip into a prescribed curvature for conforming to the image plane of a lens system.

Specifically, in one embodiment, a semiconductor, CCD imaging device is placed in a package on the surface of a mounting assembly, which has holes to the exterior of the package. The device is mounted over the holes on a bed of adhesive and a vacuum is applied through the holes to pull the (curved) wafer to conform to the flat surface of the mounting assembly. The cement, when dried, retains the chip in the desired planar configuration.

In a second embodiment, the surface of the mounting assembly is formed in a specified curvature. The CCD is again pulled into a shape to conform with the prescribed curvature and maintained in that curvature by the cement when dried.

DETAILED DESCRIPTION OF AN ILLUSTRATIVE EMBODIMENT OF THE INVENTION

Figure 1:
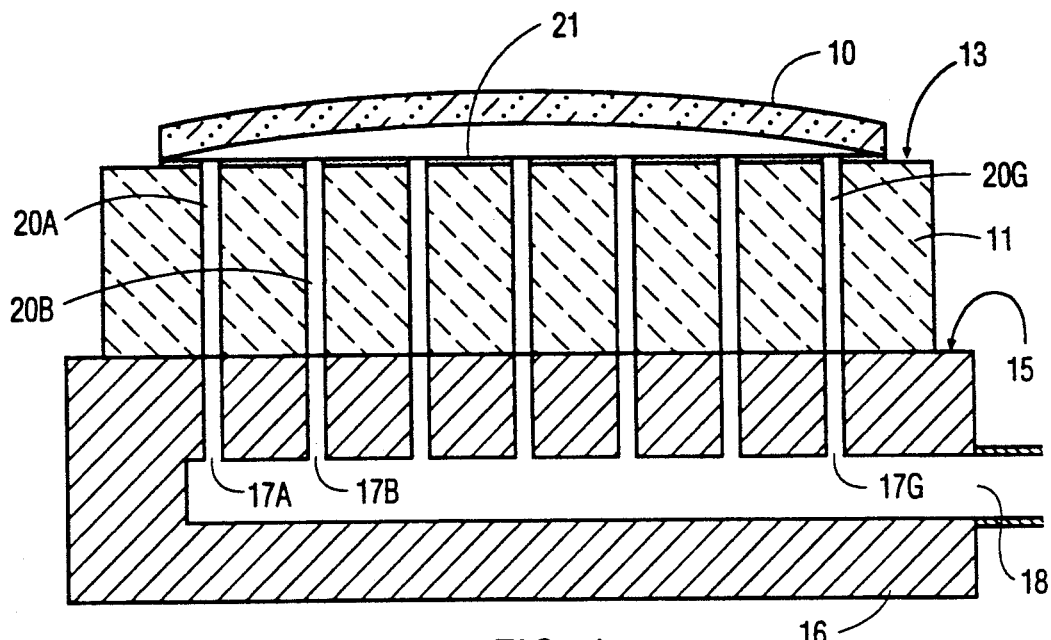
FIG. 1 is a schematic, cross sectional view of a portion of a semiconductor package in accordance with the principles of this invention.

FIG. 1 shows a cross sectional view of a semiconductor wafer 10 in position on a rigid substrate 11. The wafer is positioned on the top surface 13 of the substrate and can be seen to have a curvilinear profile, shown exaggerated when compared to surface 13 which is shown as flat. Substrate 11 is made of glass or ceramic, or some other material suitable for semiconductor packaging.

The wafer is secured to surface 13 by adhesive or solder. One suitable material is a conductive epoxy. The substrate is secured to a surface 15 of a vacuum chuck 16. The vacuum chuck is equipped with a plurality of conduits 17A, 17B, . . . 17G, which extend between a relatively large conduit 18 and surface 15. Substrate 11 also is equipped with a matching set of conduits 20A, 20B, . . . 20G.

The curvilinear profile of chip 10 is eliminated by the establishment of a vacuum in conduit 18 and in the conduits 17$i$ and 20$i$ (where i is a dummy variable) shown as 17A and 17B, . . . 17G in the Figures. The vacuum is operative to adjust the chip profile to the shape of the surface 15. In the embodiment of FIG. 1, surface 13 is flat. Therefor chip 10 becomes flat. Substrate 11 is stiff enough so that it does not bend to conform to 15 (if that surface is not flat). The wafer is constrained in that shape by adhesive layer 21. the adhesive is set, illustratively, at 80 degrees centigrade in 90 minutes.

Figure 2:
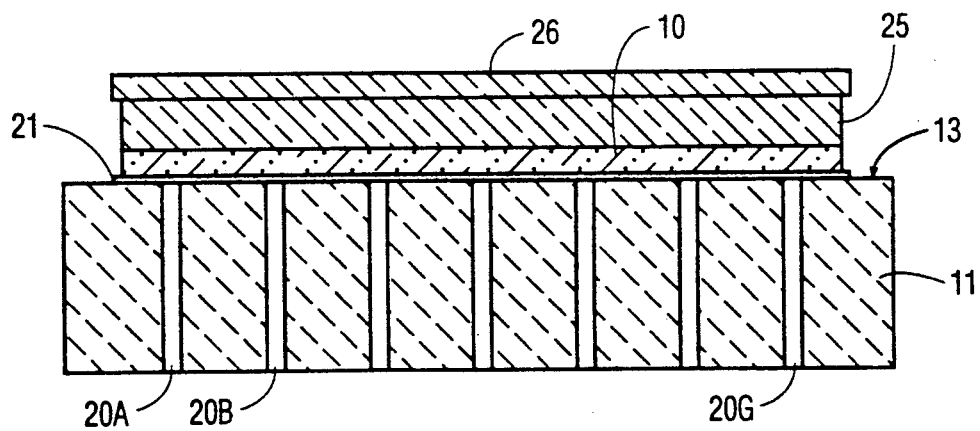
FIGS. 2 and 3 are schematic, cross sectional views of a semiconductor wafer and substrate of the package of FIG. 1.

FIG. 2 shows chip 10 with the desired flat profile secured to substrate 11. Adhesive layer 21 is shown covering the tops of conduits 20A, 20B . . . 20G. The chip may now be coated with suitable protective coatings and packaged by encapsulation with, for example, a circular ring 25 having a transparent top 26.

Figure 3:
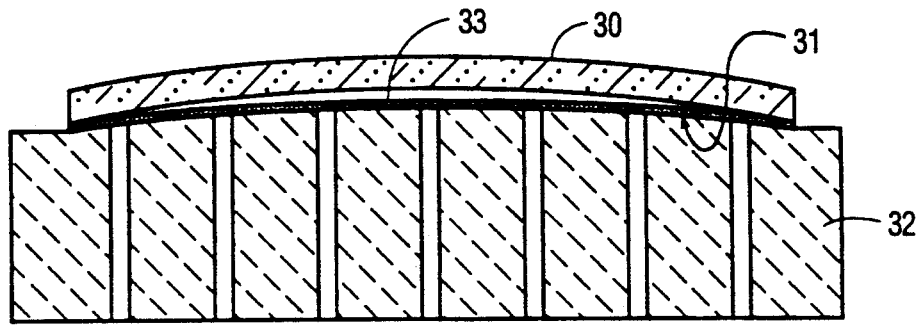

FIG. 3 illustrates an embodiment in which the curvilinear profile of a chip 30 (having a curvilinear profile) is to be secured to the surface 31 of a substrate 32 where the surface 31 also has a curvilinear surface. But the profile of surface 31 is different from that of the chip. In this embodiment, a vacuum is provided in a manner similar to that described in connection with the embodiment of FIG. 1. The chip is secured to surface 31 by a layer of adhesive 33.

A non-flat profile for a chip is desirable in many instances to conform with a mating optical system and may be used to reduce the constraints on the optical system.

Figure 4:
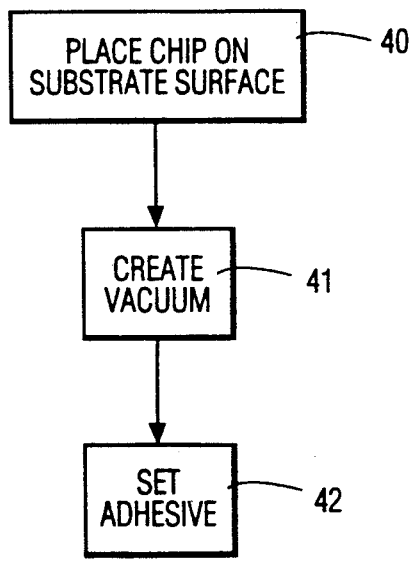
FIG. 4 is a flow diagram of the method for flattening bowed semiconductor wafers in accordance with the principles of this invention.

FIG. 4 shows a flow diagram of the method for changing the profile of a semiconductor chip in accordance with principles of this invention. The first step of the method is to place a chip with a nonflat profile on the surface of a substrate having a surface with the desired profile. This step is indicated by block 40 of FIG. 4.

The next step is to create a vacuum in the conduits of the substrate as indicated by block 41. The next step is to set the adhesive to retain the chip in the desired profile corresponding to that of the substrate surface. This step is represented by block 42.

The adhesive, for example, is EPO-TEK, H20E and sets in about 90 minutes at 80 degrees centigrade while under a vacuum of $10^{-4}$ TORR. A typical semiconductor chip of about two centimeters on a side has a non-linear profile of 30 micrometers and is made to conform to a contiguous flat (or non-flat) profile by a vacuum of about $10^{-4}$ TORR. A typical chip is 500 micrometers thick and can have its profile changed by as much as 30 micrometers without causing significant strain.

The conduits 17$i$ and 20$i$ have diameters of, for example, fifty thousandths and are formed by laser drilling. The substrates typically have dimensions of two centimeters on a side by one millimeter thick.

The adhesive enters the top of conduits 20$i$ during the vacuum adjustment of the chip profile where it may remain without significant affect.

What is claimed is:

1. Apparatus for mounting a semiconductor chip having an array of imaging cells for capturing an image incident thereto, said apparatus comprising a mounting assembly having a surface for juxtaposition with said chip, said mounting assembly including holes extending therethrough and communicating with said surface for permitting the formation of a vacuum therethrough for conforming a non planar chip to said surface.

2. Apparatus as set forth in claim 1 wherein said surface is flat, said surface being coated with an adhesive for securing said chip to said surface.

3. Apparatus as set forth in claim 2 wherein said mounting assembly comprises a rigid substrate for said chip.

4. Apparatus as set forth in claim 1 wherein said surface has a nonplanar profile different from that of said chip.

5. Apparatus as set forth in claim 4 wherein said mounting assembly comprises a rigid substrate for said chip.

* * * * *